US007250888B2

(12) United States Patent
Lin

(10) Patent No.: US 7,250,888 B2
(45) Date of Patent: Jul. 31, 2007

(54) SYSTEMS AND METHODS FOR PROVIDING DRIVING VOLTAGES TO A DISPLAY PANEL

(75) Inventor: Ching-Wei Lin, Taoyuan (TW)

(73) Assignee: Toppoly Optoelectronics Corp., Miao-Li (TW)

( * ) Notice: Subject to any disclaimer, the term of this patent is extended or adjusted under 35 U.S.C. 154(b) by 0 days.

(21) Appl. No.: 11/380,007

(22) Filed: Apr. 25, 2006

(65) Prior Publication Data

US 2007/0109169 A1 May 17, 2007

Related U.S. Application Data

(60) Provisional application No. 60/737,648, filed on Nov. 17, 2005.

(51) Int. Cl.
*H03M 1/66* (2006.01)

(52) U.S. Cl. .................... 341/144; 348/223.1; 345/204

(58) Field of Classification Search ............. 348/223.1; 341/144; 345/204

See application file for complete search history.

(56) References Cited

U.S. PATENT DOCUMENTS

| | | | | |
|---|---|---|---|---|
| 6,157,358 | A | 12/2000 | Nakajima et al. | 345/96 |
| 6,459,395 | B1 | 10/2002 | Kida et al. | 341/126 |
| 6,664,943 | B1 | 12/2003 | Nakajima et al. | 345/98 |
| 6,791,539 | B2 | 9/2004 | Nakajima et al. | 345/204 |
| 2004/0056852 | A1 * | 3/2004 | Shih et al. | 345/204 |
| 2004/0150607 | A1 | 8/2004 | Nakajima et al. | 345/100 |
| 2005/0024313 | A1 | 2/2005 | Nakajima et al. | 345/95 |

* cited by examiner

*Primary Examiner*—Jean Bruner Jeanglaude
(74) *Attorney, Agent, or Firm*—Thomas, Kayden, Horstemeyer & Risley

(57) ABSTRACT

Systems for providing driving voltage of display panels. An exemplary system comprises a data driving circuit with a plurality of driving units generating analog voltage to drive corresponding pixels according to digital data signals from a data bus, each comprising a temporary storage unit storing N digital data in sequence according to N control signals in a first period and outputting the N digital data in sequence according to M switching signals in a second period; a digital-to-analog (DA) conversion unit converting the N digital data to N analog voltages in sequence; an analog buffering unit buffering the N analog voltages from the DA conversion unit; and a de-multiplexer outputting the N analog voltages to the corresponding pixels selectively according to an enabling signal.

21 Claims, 12 Drawing Sheets

SYSTEMS AND METHODS FOR PROVIDING DRIVING VOLTAGES TO A DISPLAY PANEL

CROSS REFERENCE TO RELATED APPLICATION

This application claims the benefit of U.S. Provisional Application No. 60/737,648, filed Nov. 17, 2005.

BACKGROUND OF THE INVENTION

1. Field of the Invention

The invention relates to display panels.

2. Description of the Related Art

Liquid crystal displays (LCDs) are used in a variety of applications, including calculators, watches, color televisions, computer monitors, and many other electronic devices. Active-matrix LCDs are a well known type of LCDs. In a conventional active matrix LCD, each picture element (or pixel) is addressed using a matrix of thin film transistors (TFTs) and one or more capacitors. The pixels are arranged and wired in an array having a plurality of rows and columns.

To address a particular pixel, the switching TFTs of a specific row are switched "on" (i.e., charged with a voltage), and then data voltage is sent to the corresponding column. Since other intersecting rows are turned off, only the capacitor at the specific pixel receives the data voltage charge. In response to the applied voltage, the liquid crystal cell of the pixel changes its polarization, and thus, the amount of light reflected from or passing through the pixel changes. In liquid crystal cells of a pixel, the magnitude of the applied voltage determines the amount of light reflected from or passing through the pixel.

Further, "System-on-glass" LCDs that allow integration of various LCD driving circuits and functions require no external integrated circuits (ICs), providing low cost, compact and highly reliable displays. The integrated driving circuits of such an LCD comprise a vertical driving circuit selecting a row of pixels and a horizontal driving circuit writing display data into each pixel in the selected row.

As shown in FIG. 1A, because of design-rule limitations in low temperature polysilicon (LTPS) processes, conventionally double RGB pixel pitch (2PP) is required to contain a set of RGB analog buffers and RGB digital to analog converters (DACs) for each RGB pixel. For example, the sampling latches may sample the data signals from the digital data bus DDB according to the control signal provided by a horizontal shift register, and the sampled data in the sampling latches is output to corresponding holding latches according the enabling signal OE. The held data signal in the holding latches are converted to RGB analog signals and output to a corresponding pixel through corresponding RGB analog buffers. Thus, a display panel requires two horizontal driving circuits disposed on the upper and lower area of the frame area respectively, as shown in FIG. 1B. However, this occupies a lot of layout area, such that panel frame size is enlarged. Moreover, in order to divide data signals from the host system for the two horizontal driving circuits, a data processing circuit 33 is further required, as shown in FIG. 1B.

As shown in FIG. 2A, another horizontal driving circuit reduces required area, with the operation timing chart thereof shown in FIG. 2B. As shown, the sampling latches sample the RGB data signals from the digital data bus DDB according to the control signal provided by the horizontal shift register, and the sampled data in the sampling latches output to corresponding holding latches according to enabling signal OE. According to the data enabling signal DE and the de-multiplexers, R data signals, G data signals, and B data signals held in the holding latches are converted to RGB analog signals by one DA converter in sequence and output to corresponding RGB pixels through one analog buffer. Namely, one DA converter and one analog buffer are shared for RGB pixels, thereby reducing required layout area for horizontal driving circuits. However, this also requires double RGB pixel pitch (2PP) for each RGB pixel driving circuit, because the sampling and holding latches dominate the width of layout of the RGB pixel driving circuit.

BRIEF SUMMARY OF INVENTION

Systems for providing driving voltages of display panels are disclosed. In this regard, an embodiment of such a system comprises a data driving circuit with a plurality of driving units operative to generate analog voltages driving corresponding pixels according to data signals from a data bus, each comprising a temporary storage unit to store N digital data in sequence according to N control signals in a first period and output the N digital data in sequence according to M switching signals in a second period; a digital-to-analog (DA) conversion unit operative to convert the N digital data to N analog voltages in sequence; an analog buffering unit operative to buffer the N analog voltages from the DA conversion unit; and a de-multiplexer operative to selectively output the N analog voltages to the corresponding pixels according to an enabling signal.

Another embodiment of a system comprises a driving circuit with first and second driving units operative to generate analog voltages according to data signals from a data bus, each comprising a temporary storage unit to store first digital data and second digital data in sequence according to a first control signal and a second control signal and to output the first digital data and the second digital data in sequence according to first to third switching signals; a digital-to-analog (DA) conversion unit operative to convert the first digital data and the second digital data to a first analog voltage and a second analog voltage; an analog buffering unit operative to buffer the first analog voltage and the second analog voltage from the DA conversion unit; and a de-multiplexer operative to output the first analog voltage and the second analog voltage to drive a first pixel and a second pixel in sequence according to an enabling signal.

Another embodiment of a system comprises: a first pixel; a second pixel; and a driving unit having a digital to analog converter unit and an analog buffering unit and being operative to drive the first pixel and the second pixel in sequence using the digital to analog unit and analog buffering unit for driving each of the first and second pixels with analog voltages.

Methods for providing driving voltages of display panels also are provided. In this regard, an embodiment of such a method comprises: first digital data and second digital data are stored in sequence to a plurality of sets of latches connected in series according to first and second control signals during a first period; the first digital data and a second digital data are output to a digital-to-analog conversion unit in sequence according to first to third switching signals during a second period; the first digital data and the second digital data are converted to a first driving voltage and a second driving voltage in sequence; and the first driving voltage and the second driving voltage are output to a first pixel and a second pixel in sequence according an enabling signal.

BRIEF DESCRIPTION OF DRAWINGS

The invention can be more filly understood by reading the subsequent detailed description and examples with references made to the accompanying drawings, wherein.

DETAILED DESCRIPTION OF INVENTION

This description is made for the purpose of illustrating the general principles of the invention and should not be taken in a limiting sense. The scope of the invention is best determined by reference to the appended claims.

Figure 3A:
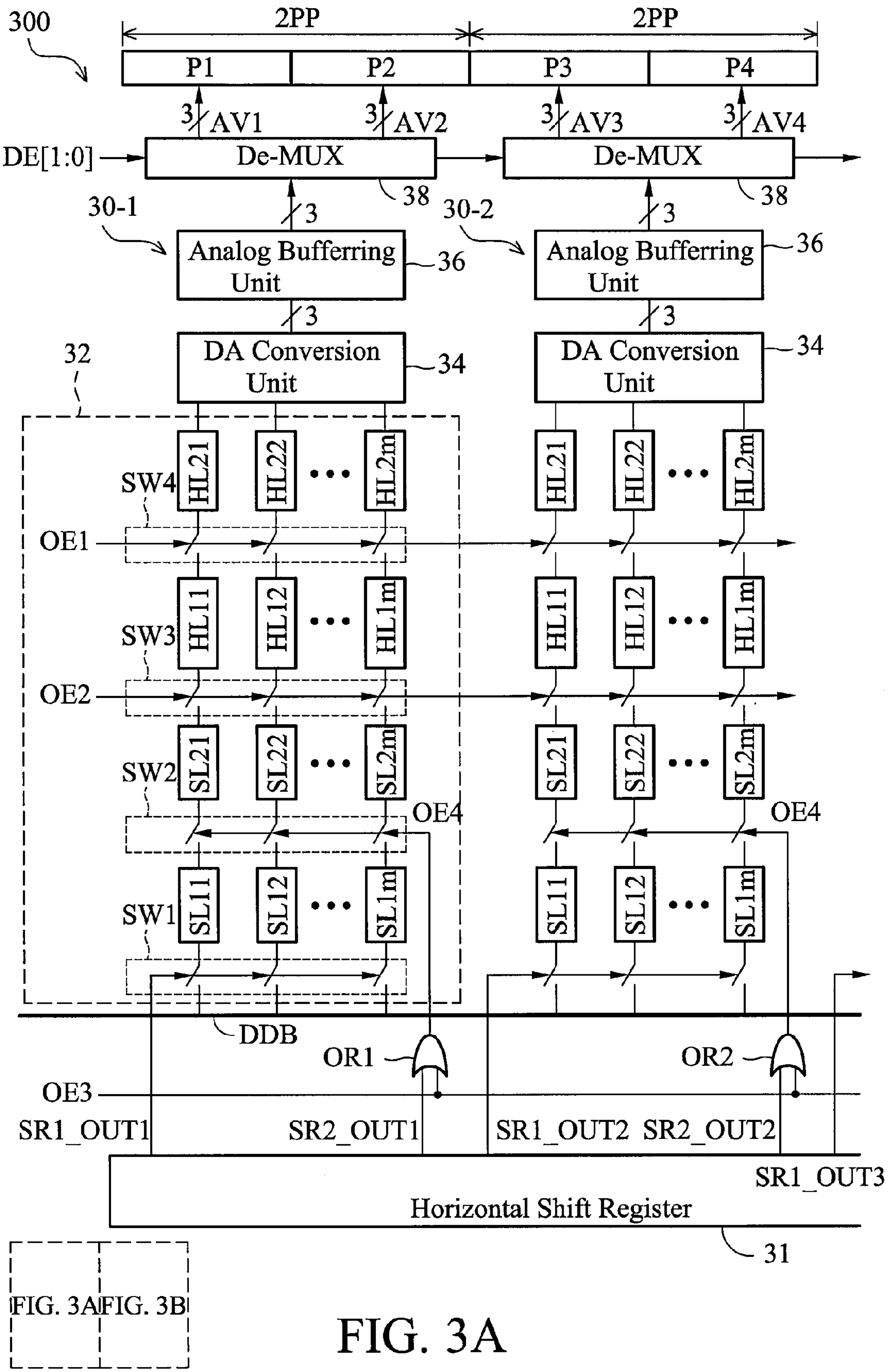
FIGS. 3A and 3B show an embodiment of a data driver.
Figure 3B:
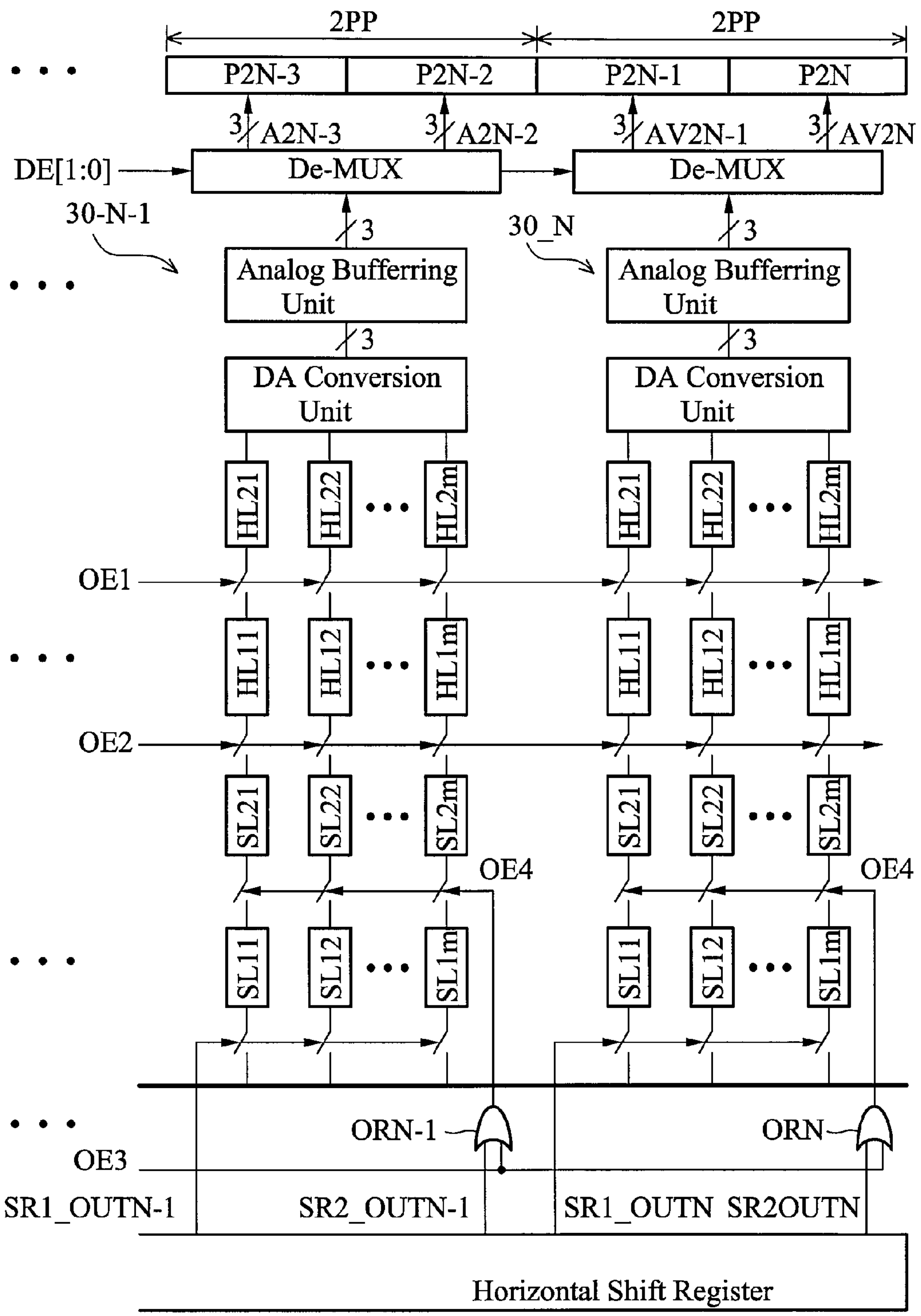

An embodiment of a system for providing driving voltages to a display panel is depicted in FIGS. 3A and 3B. As shown in FIGS. 3A and 3B, the data driver 300 comprises a horizontal shifter register 31, OR gates OR1~ORN and N driving units 30_1~30_N coupled to a digital data bus DDB. The data driver receives digital data from a host system, and provides corresponding analog voltages to corresponding pixels P1~P2N of a display panel. For example, the digital data can be 18 bit or 24 bit digital data, but is not limited thereto.

Figure 3C:
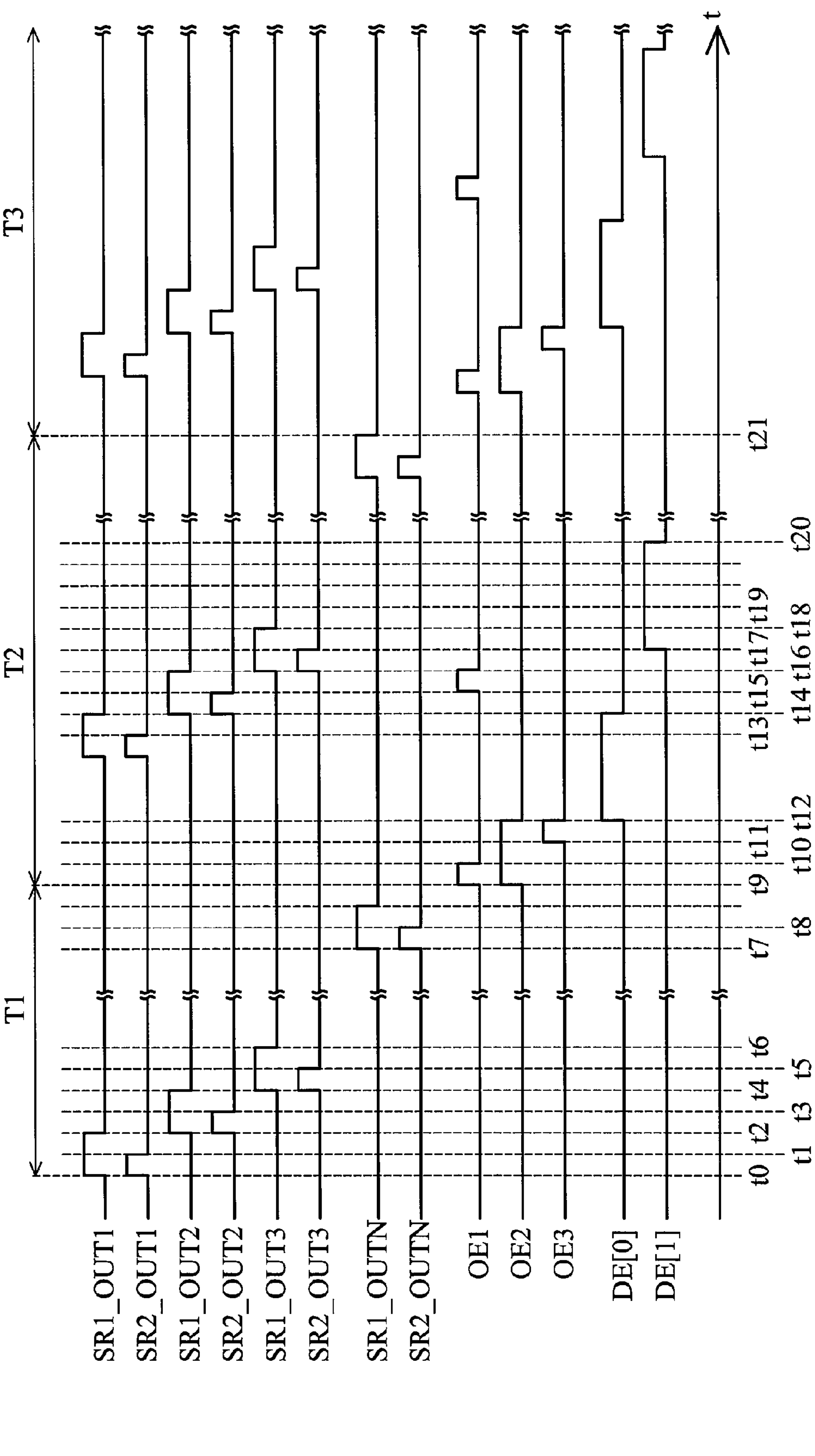
FIG. 3C is a timing control diagram of the data driver shown in FIGS. 3A and 3B.
Figure 5:
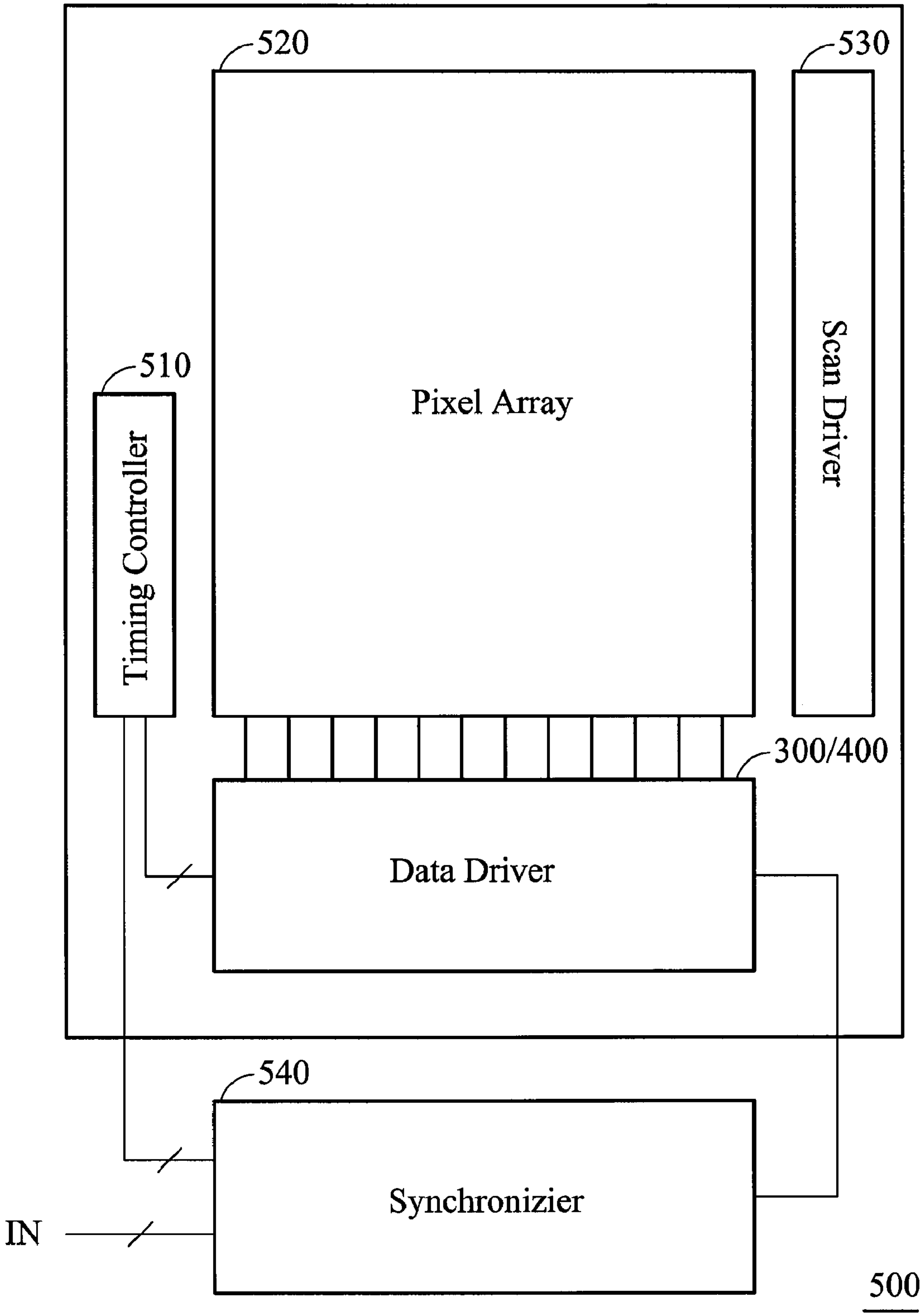
FIG. 5 is a schematic diagram of another embodiment of a display panel.

The horizontal shifter register 31 generates two sets of control signals SR1_OUT1~SR1_OUTN and SR2_OUT1~SR2_OUTN to control the N driving units 30_1~30_N. For example, the horizontal shifter register 20 can generate the control signals SR1_OUT1~SR1_OUTN in sequence and the control signals SR2_OUT1~SR2_OUTN in sequence, with a timing chart of the control signals shown in FIG. 3C. Switching signals OE1~OE3 are provided by a timing controller 510 as shown in FIG. 5. In this embodiment, the switching signal OE4 is generated by OR gates OR1~ORN according to the switching signal OE3 and the control signals SR2_OUT1~SR2_OUTN.

Each driving unit 30_1~30_N can be implemented within a width limitation of double RGB pixel pitch (2PP) and comprises a temporary storage unit 32, a digital-to-analog (DA) conversion unit 34, an analog buffering unit 36 and de-multiplexer 38. Each generates analog voltages to drive corresponding pixels P1~P2N in sequence according to digital data from the data bus DDB.

The temporary storage unit 32 stores digital data (not shown) in sequence according to control signals SR1_OUT1 and SR2_OUT1 in a first period and outputs the digital data in sequence according to switching signals OE1~OE3 in a second period. The temporary storage unit 32 comprises four sets of latches connected in series, that is, sampling latches SL11~SL1m and SL21~SL2m and holding latches HL11~HL1m and HL21~HL2m, and four sets of switching elements SW1, SW2, SW3 and SW4.

The switching elements SW1 are coupled between the digital data bus DDB and the sampling latches SL11~SL1m, and are controlled by the control signal SR1_OUT1. The switching elements SW2 are coupled between the sampling latches SL11~SL1m and the sampling latches SL21~SL2m, and are controlled by the switching signal OE4. The switching elements SW3 are coupled between the sampling latches SL21~SL2m and the holding latches HL11~HL1m, and are controlled by switching signal OE2. The switching elements SW4 are coupled between the holding latches HL11~HL1m and the holding latches HL21~HL2m, and are controlled by switching signal OE1.

The digital-to-analog (DA) conversion unit 34 converts the N digital data from the temporary storage unit 32 to N analog voltages in sequence. For example, the DA conversion unit 34 can convert the 18 bit or 24 bit digital data from the temporary storage unit 32 to RGB analog voltages, such as AV1 or AV2, for a corresponding pixel once. Namely, the DA conversion unit 34 converts the digital data from the temporary storage unit 32 to RGB analog voltages AV1 and AV2 in sequence for corresponding pixels. The analog buffering unit 36 buffers the N analog voltages, such as AV1 and AV2, from the DA conversion unit 36. The de-multiplexer 38 selectively outputs the N analog voltages, such as AV1 and AV2, to the corresponding pixels according to an enabling signal DE. For example, the de-multiplexer 38 can output the analog voltages AV1 to a first pixel P1 and the analog voltage AV2 to a second pixel P2 in sequence according to the enabling signal. In this embodiment, the enabling signal can be a data enabling signal provided by the timing controller 510 shown in FIG. 5.

With reference to FIGS. 3A and 3B, during time interval t0~t1, because the control signal SR2_OUT1 goes high, and the switching signal OE4 output from the OR gate OR1 goes high accordingly. As the control signal SR2_OUT1 and the switching signal OE4 go high, the switching elements SW1 and SW2 in the driving unit 30_1 are both turned on, such that a first digital data on the data bus DDB from a host system (not shown) is stored to latches SL11~SL1m and SL21~SL2m in the driving unit 30_1.

During time interval t1~t2, because the control signal SR2_OUT1 goes low, the switching signal OE4 output from the OR gate OR1 goes low accordingly. As the control signal SR2_OUT1 goes high and the switching signal OE4 goes low, the switching elements SW1 stay on and the switching elements SW2 are turned off in the driving unit 30_1, such that second digital data on the data bus DDB from the host system is stored to latches SL11~SL1m in the driving unit 30_1. Namely, the first and second digital data are stored to latches SL21~SL2m and SL11~SL1m of the driving unit 30_1 in sequence according to the control signals SR1_OUT1 and SR2_OUT1.

During time interval t2~t3, because the control signal SR2_OUT2 goes high, the switching signal OE4 output from the OR gate OR2 goes high accordingly. As the control signal SR2_OUT1 and the switching signal OE4 go high, the switching elements SW1 and SW2 in driving unit 30_2 are both turned on, such that third digital data on the data bus DDB from the host system is stored to latches SL11~SL1m and SL21~SL2m in the driving unit 30_2.

During time interval t3~t4, because the control signal SR2_OUT2 goes low, the switching signal OE4 output from the OR gate OR2 goes low accordingly. As the control signal SR2_OUT2 goes high and the switching signal OE4 goes low, the switching elements SW1 stay on and the switching elements SW2 are turned off in the driving unit 30_2, such that fourth digital data on the data bus DDB from the host system is stored to latches SL11~SL1m in the driving unit 30_2. Namely, the third and fourth digital data are stored to latches SL21~SL2m and SL11~SL1m of the driving unit 30_2 in sequence according to the control signals SR1_OUT2 and SR2_OUT2.

During time interval t4~t5, fifth digital data on the data bus DDB from the host system is stored to latches SL11~SL1m and SL21~SL2m in the driving unit 30_3. During time interval t5~t6, sixth digital data on the data bus DDB from the host system is stored to latches SL11~SL1m in the driving unit 30_3. Namely, the fifth and sixth digital data are stored to latches SL21~SL2m and SL11~SL1m of the driving unit 30_3 in sequence according to the control signals SR1_OUT3 and SR2_OUT3, and so on. During time interval t7~t8, $2N-1^{th}$ digital data on the data bus DDB from the host system is stored to latches SL11~SL1m and SL21~SL2m in the driving unit 30_N. During time interval t8~t9, $2N^{th}$ digital data on the data bus DDB from the host system is stored to latches SL11~SL1m in the driving unit 30_N. Namely, the $2N-1^{th}$ and $2N^{th}$ digital data are stored to latches SL21~SL2m and SL11~SL1m of the driving unit 30_N in sequence according to the control signals SR1_OUTN and SR2_OUTN. That is to say, the first digital data to 2Nth digital data are stored to the latches in the driving unit 30_1~30_N in sequence according to control signals SR1_OUT1~SR1_OUTN and SR2_OUT1~SR2_OUTN provided by the horizontal shift register 20 during period T1.

During time interval t9~t10, the switching signals OE1 and OE2 both go high, and the switching elements SW3 and SW4 in the driving units 30_1~30_N are turned on, such that the digital data stored in the latches SL21~SL2m in the driving units 30_1~30_N is output to the holding latches HL21~HL2m and the corresponding DA conversion unit 34. For example, the first and third digital data stored in the latches SL21~SL2m in the driving units 30_1 and 30_2 can be output to the holding latches HL21~HL2m and the corresponding DA conversion unit 34, and so on.

Thus, the corresponding DA conversion units 34 convert the received digital data to analog voltages for output to the corresponding analog buffering units 36, and the corresponding analog buffering units 36 buffer analog voltages. For example, the DA conversion units 34 in the driving units 30_1 and 30_2 can convert the first and third digital data to analog voltages AV1 and AV3 for output to the analog buffering units 36, and the analog buffering units 36 buffer analog voltages AV1 and AV3, and so on.

At time t10, because the switching signal OE1 goes low, the switching elements SW4 are turned off, and switching elements SW3 stay on. During time interval t11~t12, because the switching signal OE3 goes high, the switching signal OE4 goes high accordingly, such that the switching elements SW2 are turned on. As the switching elements SW2 are turned on and the switching elements SW3 stay on, the digital data stored in the latches SL11~SL1m in the driving units 30_1~30_N is output to the holding latches HL11~HL1m. For example, the second and fourth digital data stored in the latches SL11~SL1m in the driving units 30_1 and 30_2 are output to the holding latches HL11~HL1m, and so on.

At time t12, the switching signals OE2 and OE3 both go low, such that the switching elements SW2 and SW3 are both turned off. During time interval t12~t14, data enabling signal DE[0] goes high, the de-multiplexers 38 output the analog voltages buffered in the analog buffering units 36 to corresponding pixels. For example, the de-multiplexer 38 can output the analog voltages AV1 to the pixel P1, the analog voltage AV3 to the pixel P3, the analog voltages AV2N-3 to the pixel P2N-3 , the analog voltage AV2N-1 to the pixel P2N-1 according to the enabling signal, and so on. At time t14, data enabling signal DE[0] goes low, the de-multiplexers 38 stop outputting the analog voltages buffered in the analog buffering units 36.

During time interval t1~t16, the switching signal OE1 goes high, the switching elements SW4 in the driving units 30_1~30_N are turned on, such that the digital data stored in the latches HL11~HL1m in the driving units 30_1~30_N is output to the holding latches HL21~HL2m and the corresponding DA conversion unit 34. For example, the second and fourth digital data stored in the latches HL11~HL1m in the driving units 30_1 and 30_2 is output to the holding latches HL21~HL2m and the corresponding DA conversion unit 34, and so on.

Thus, the corresponding DA conversion units 34 convert the received digital data to analog voltages for output to the corresponding analog buffering units 36, and the corresponding analog buffering units 36 buffer analog voltages. For example, the DA conversion units 34 in the driving units 30_1 and 30_2 convert the second and fourth digital data to analog voltages AV2 and AV4 and output to the analog buffering units 36, and the analog buffering units 36 buffer analog voltages AV2 and AV4, and so on.

During time interval t17~t20, data enabling signal DE[1] goes high, and the de-multiplexers 38 output the analog voltages buffered in the analog buffering units 36 to corresponding pixels. For example, the de-multiplexer 38 outputs the analog voltages AV2 to the pixel P2, the analog voltage AV4 to the pixel P4, the analog voltages AV2N-2 to the pixel P2N-2 , the analog voltage AV2N to the pixel P2N according to the enabling signal, and so on. At time t20, data enabling signal DE[1] goes low, and the de-multiplexers 38 stop outputting the analog voltages buffered in the analog buffering units 36.

Since driving units 30_1~30_2 output the analog voltages to the corresponding pixels during time interval t9~t20 and also store new digital data to latches SL11~SL1m and SL21~SL2m during time interval t13~t21, operation thereof is similar to that during period T1 and further description is omitted for simplification. Namely, the driving unit 30_1~30_N output the 2N analog voltages to the corresponding pixels P1~P2N and receive new digital data during the period T2.

In this embodiment, because one driving unit can drive two corresponding pixels in sequence by sharing a set of DA conversion units, digital data sampling and holding unit, analog buffering unit and a de-multiplexer, the total number of buffers and DA converters of the whole driver can be reduced, and each driving unit can be implemented within the width limitation of double RGB pixel pitch (2PP). Thus, the peripheral area consumption of the display panel can be reduced.

Figure 4A:
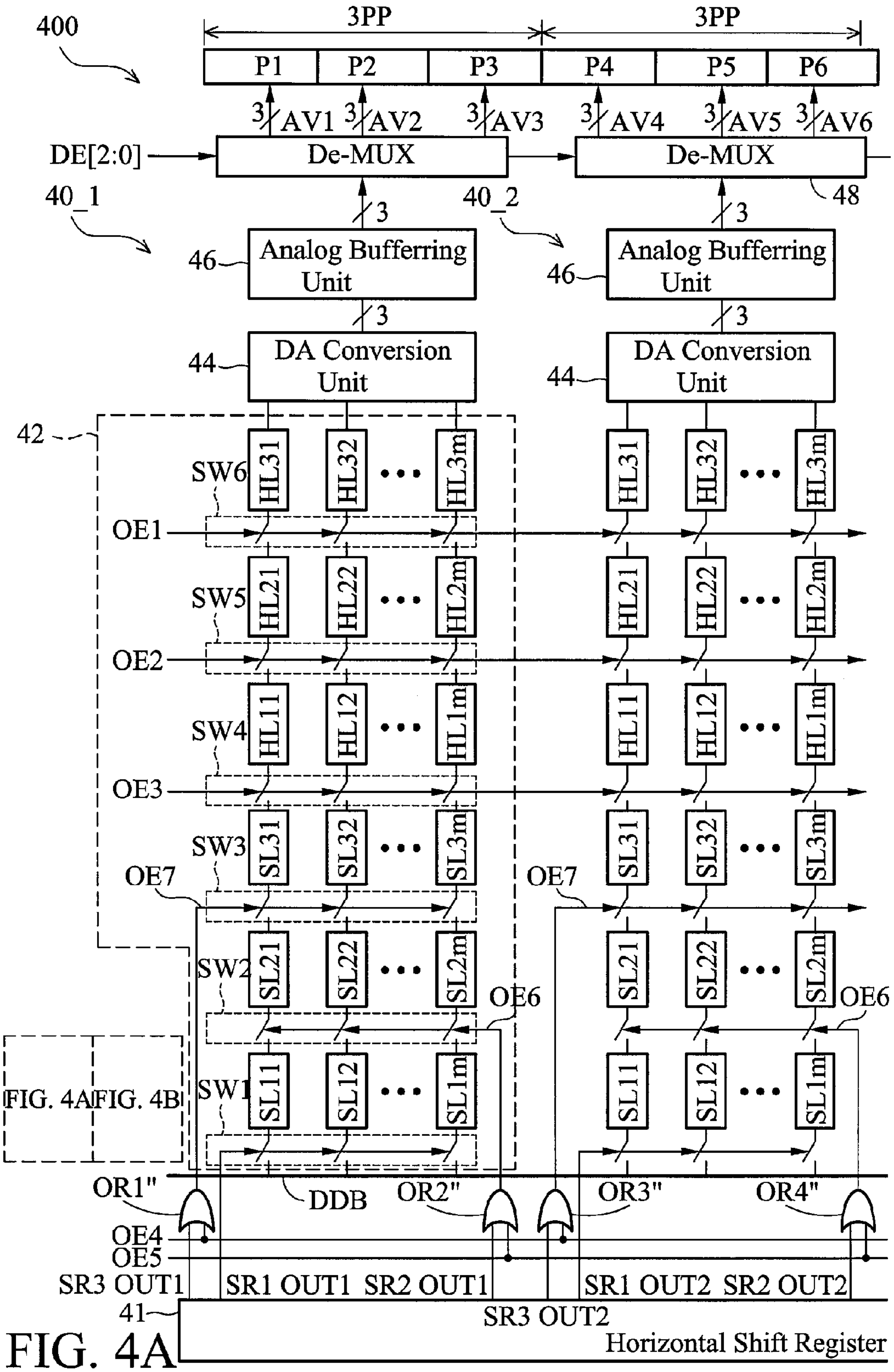
FIGS. 4A and 4B show another embodiment of a data driver.
Figure 4B:
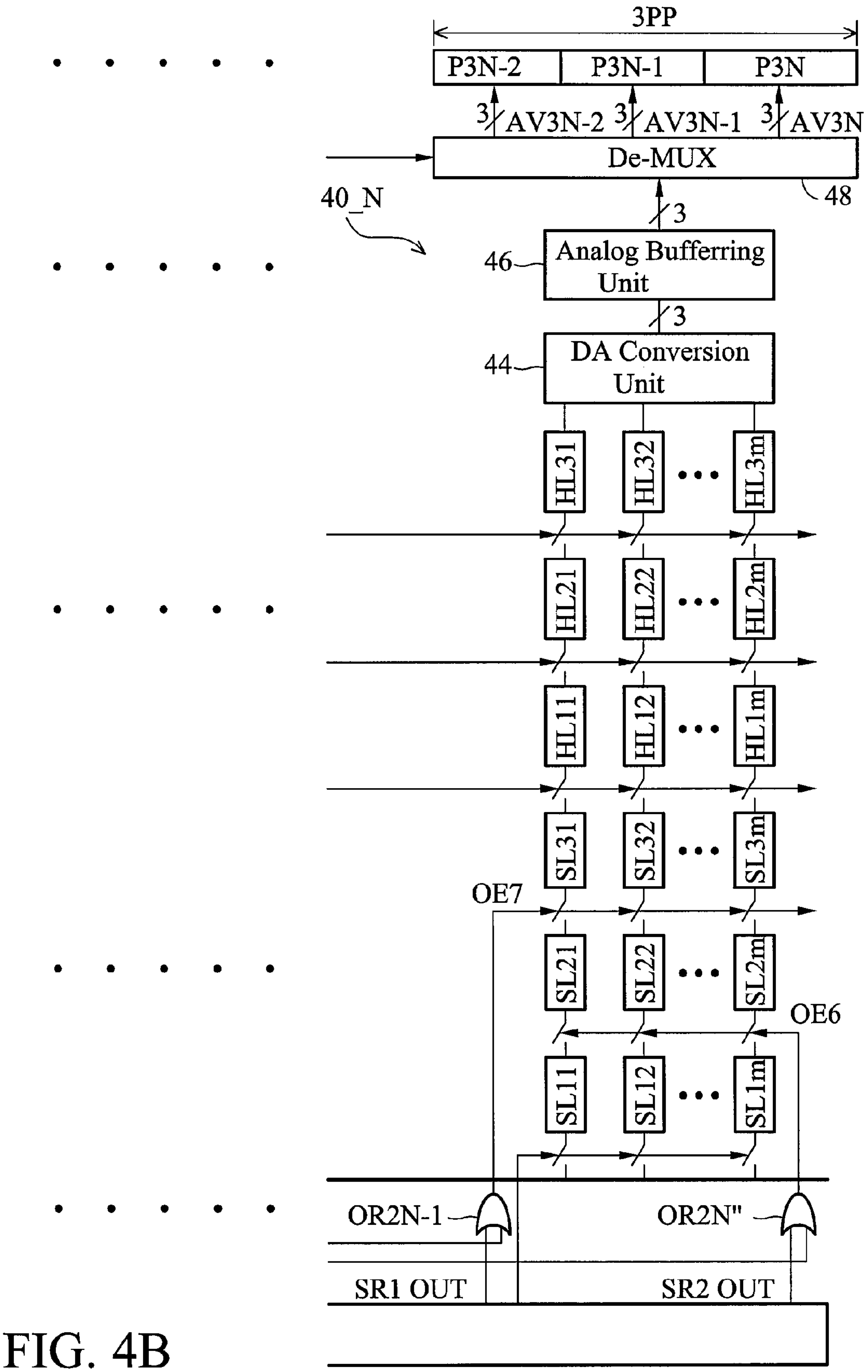

FIGS. 4A and 4B show an embodiment of a system providing driving voltages to a display panel. As shown, the data driver 400 comprises a horizontal shifter register 41, OR gates OR1"~OR2N" and N driving units 40_1~40_N coupled to a digital data bus DDB. The data driver receives digital data from a host system and provides corresponding analog voltages to corresponding pixels P1~P3N of a display panel.

The horizontal shifter register 41 generates three sets of control signals SR1_OUT1~SR1_OUTN, SR2_OUT1~SR2_OUTN and SR3_OUT1~SR3_OUTN to control the N driving units 40_1~40_N. For example, the horizontal shifter register 41 generates the control signals SR1_OUT1~SR1_OUTN in sequence, the control signals SR2_OUT1~SR2_OUTN in sequence and SR3_OUT1~SR3_OUTN in sequence and timing chart of the control signals is shown in FIG. 4B. The switching signals OE1~OE5 are provided by the timing controller 510 shown in FIG. 5.

Each driving unit 40_1~40_N can be implemented within width limitation of triple RGB pixel pitch (3PP). Each comprises a temporary storage unit 42, a digital-to-analog (DA) conversion unit 44, an analog buffering unit 46 and de-multiplexer 48, and generates analog voltages to drive corresponding pixels P1~P3N in sequence according to digital data from the data bus DDB.

The temporary storage unit 42 stores digital data (not shown) in sequence according to control signals SR1_OUT1, SR2_OUT1 and SR3_OUT1 in a first period and outputs the digital data in sequence according to switching signals OE1~OE5 in a second period. The temporary storage unit 42 comprises six sets of latches connected in series, such that sampling latches SL11~SL1m, SL21~SL2m and SL31~SL3m and holding latches HL11~HL1m, HL21~HL2m and HL31~HL3m, and six sets of switching elements SW1~SW6.

The switching elements SW1 are coupled between the digital data bus DDB and the sampling latches SL11~SL1m, and are controlled by the control signal SR1_OUT1. The switching elements SW2 are coupled between the sampling latches SL11~SL1m and the sampling latches SL21~SL2m, and are controlled by the switching signal OE6. The switching elements SW3 are coupled between the sampling latches SL21~SL2m and the sampling latches SL31~SL3m, and are controlled by switching signal OE7. The switching elements SW4 are coupled between the sampling latches SL31~SL3m and the holding latches HL11~HL1m, and are controlled by switching signal OE3. The switching elements SW5 are coupled between the holding latches HL11~SL1m and the holding latches HL21~HL2m, and are controlled by switching signal OE2. The switching elements SW6 are coupled between the holding latches HL21~HL2m and the holding latches HL31~HL3m, and are controlled by switching signal OE1. For example, in the driving unit 40_1, the switching signal OE6 is output by the OR gate OR2" according to the control signal SR2_OUT1 and switching signal OE5, and the switching signal OE7 is output by the OR gate OR1" according to the control signal SR3_OUT1 and switching signal OE4. In the driving unit 40_2, the switching signal OE6 is output by the OR gate OR4" according to the control signal SR2_OUT2 and switching signal OE5, and the switching signal OE7 is output by the OR gate OR3" according to the control signal SR3_OUT2 and switching signal OE4, and so on.

The digital-to-analog (DA) conversion unit 44 converts the N digital data from the temporary storage unit 42 to N analog voltages in sequence. For example, the DA conversion unit 44 can convert the 18 bit or 24 bit digital data from the temporary storage unit 42 to a RGB analog voltage, such as AV1, AV2 or AV3, for a corresponding pixel once. Namely, the DA conversion unit 44 converts the digital data from the temporary storage unit 42 to RGB analog voltages AV1, AV2 and AV3 in sequence to corresponding pixels P1~P3. The analog buffering unit 46 buffers the N analog voltages, such as AV1, AV2 and AV3, from the DA conversion unit 44. The de-multiplexer 48 selectively outputs the N analog voltages, such as AV1, AV2 and AV3, to the corresponding pixels P1~P3 according to an enabling signal. For example, the de-multiplexer 48 outputs the analog voltages AV1 to a first pixel P1, the analog voltage AV2 to a second pixel P2 and the analog voltage AV3 to a third pixel P3 in sequence according to the enabling signal. In this embodiment, the enabling signal can be a data enabling signal provided by the timing controller 510 shown in FIG. 5.

Figure 4C:
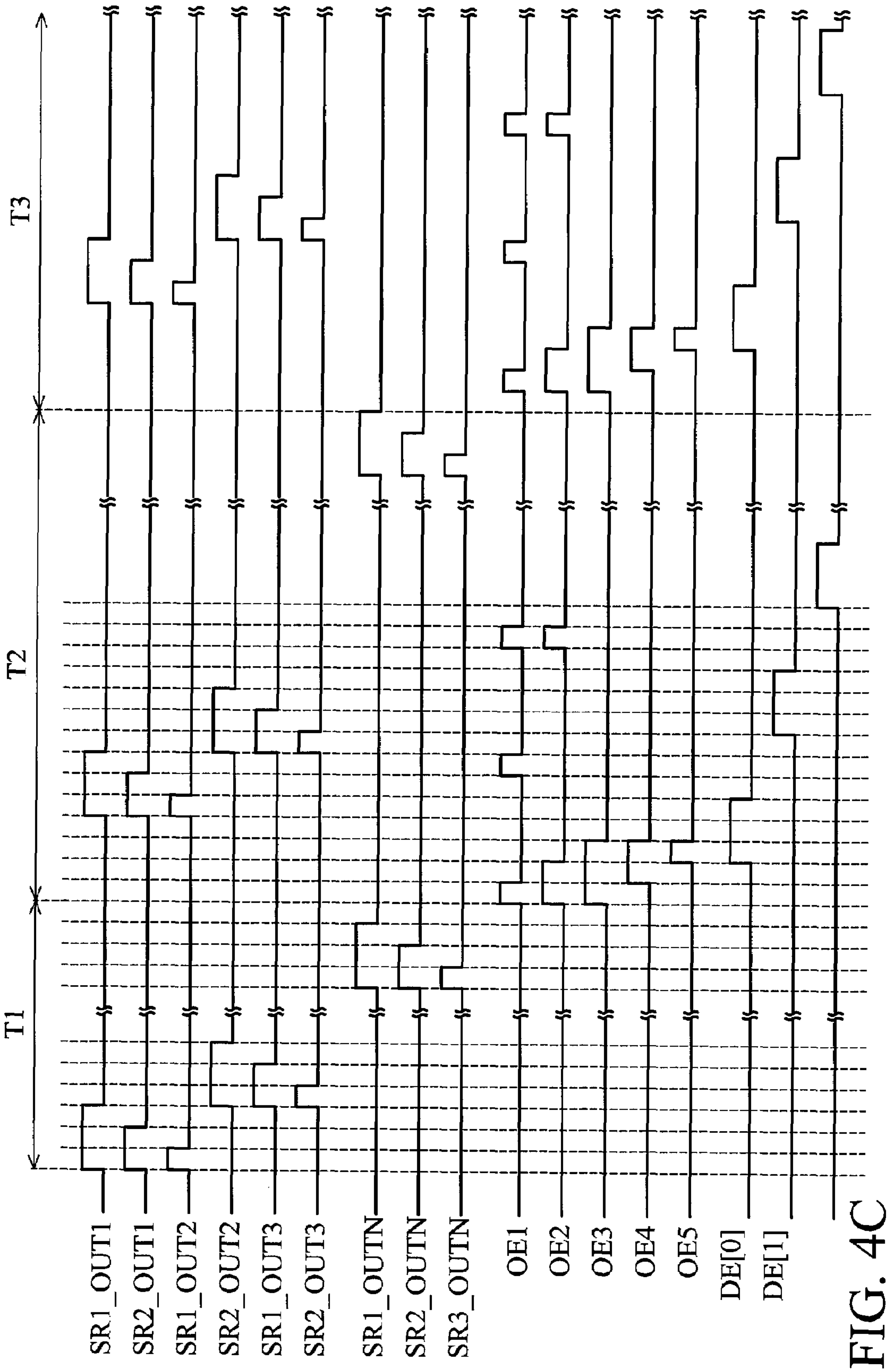
FIG. 4C is a timing control diagram of the data driver shown in FIGS. 4A and 4B.

FIG. 4C is control timing chart of data driver shown in FIGS. 4A and 4B, the operation of the data driver is similar to that driver 300 shown in FIGS. 3A and 3B, and description thereof is omitted for simplification. That is to say, the first digital data to 3Nth digital data are stored to the latches in the driving unit 40_1~40_N in sequence according to control signals SR1_OUT1~SR1_OUTN, SR2_OUT1~SR2_OUTN and SR1_OUT1~SR1_OUTN provided by the horizontal shift register 41 during period T1. The driving units 40_1~40_N output the 3N analog voltages to the corresponding pixels P1~P3N and receives new digital data during the period T2.

In this embodiment, because one driving unit can drive three corresponding pixels in sequence by sharing DA conversion units, analog buffering units, digital data sampling and holding unit, and de-multiplexers, total number of buffers and DA converters of the whole driver can be further reduced, and each driving unit can be implemented within the width limitation of three RGB pixel pitch (3PP). Thus, the peripheral area consumption of the display panel can be further reduced.

FIG. 5 is a schematic diagram of another embodiment of a system, in this case a display panel, providing driving voltages. As shown in FIG. 5, the display panel 500 comprises the described data driver 300/400, a timing controller 510, a pixel array 520, a scan driver 530 and a synchronizer 540, preferably integrated on one glass substrate by system-on-glass (SOG). The timing controller provides switching signals OE1~OE5 and enabling signal DE to the data driver 300/400 and a clock signal to the synchronizer 540. The pixel array 520 comprises color pixels arranged in a matrix, a plurality of data lines and a plurality of scan lines, in which each pixel comprises RGB sub-pixels. The data driver 300/400 generates analog driving voltages for the pixel array 520, and the gate driver 530 provides scan signals to the pixel array 520 such that the scan lines are asserted or de-asserted. The pixel array 520 generates color images according to the analog driving voltages from the data driver 300/400. The synchronizer 540 synchronizes digital data from the host system with the clock signal while the display panel 500 can be an organic light emitting panel, an electroluminescent panel or a liquid crystal display panel, various other technologies can be used in other embodiments.

Figure 1A:
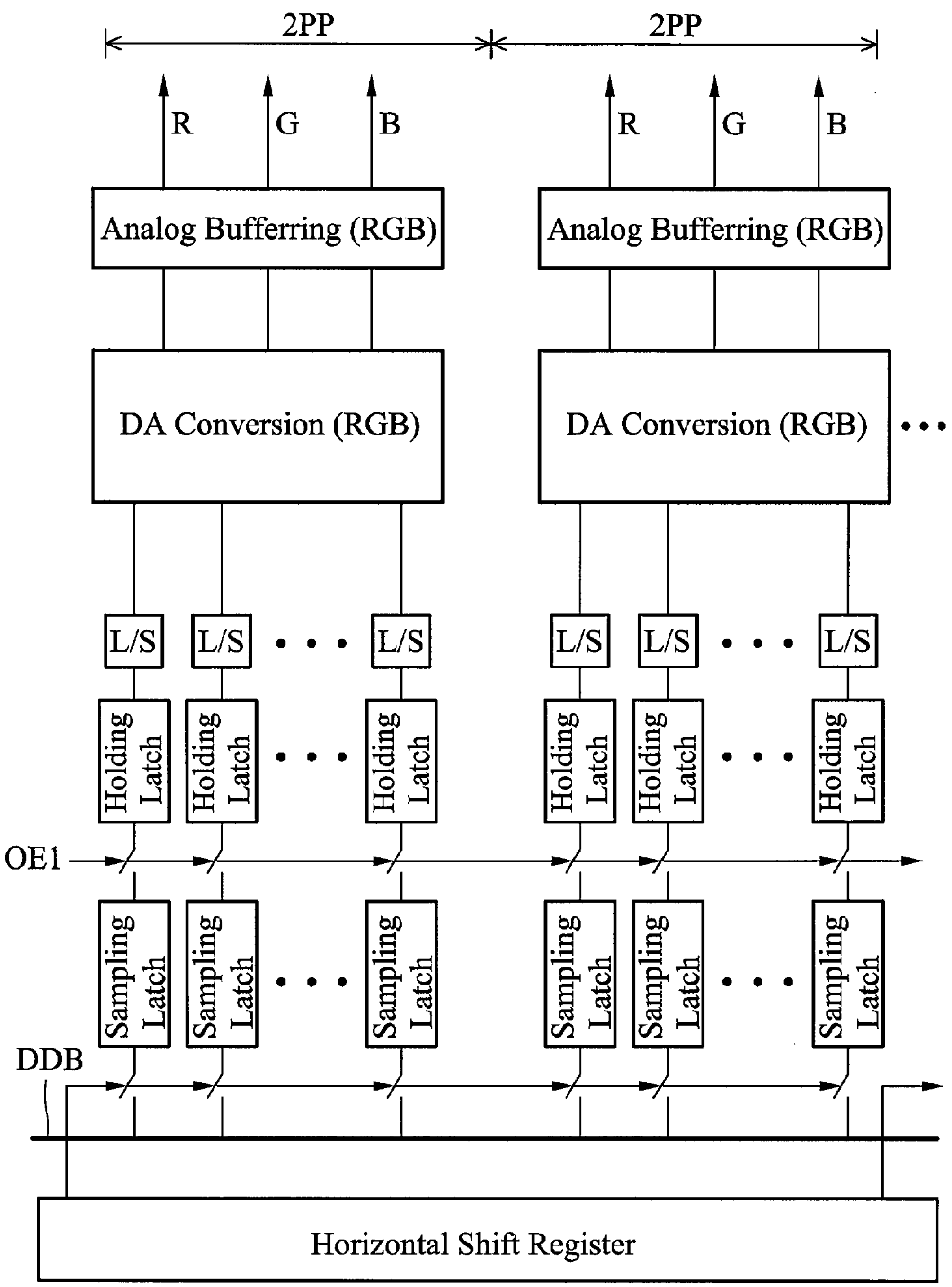
FIG. 1A( RELATED ART )
FIG. 1A shows a conventional data driver.
Figure 1B:
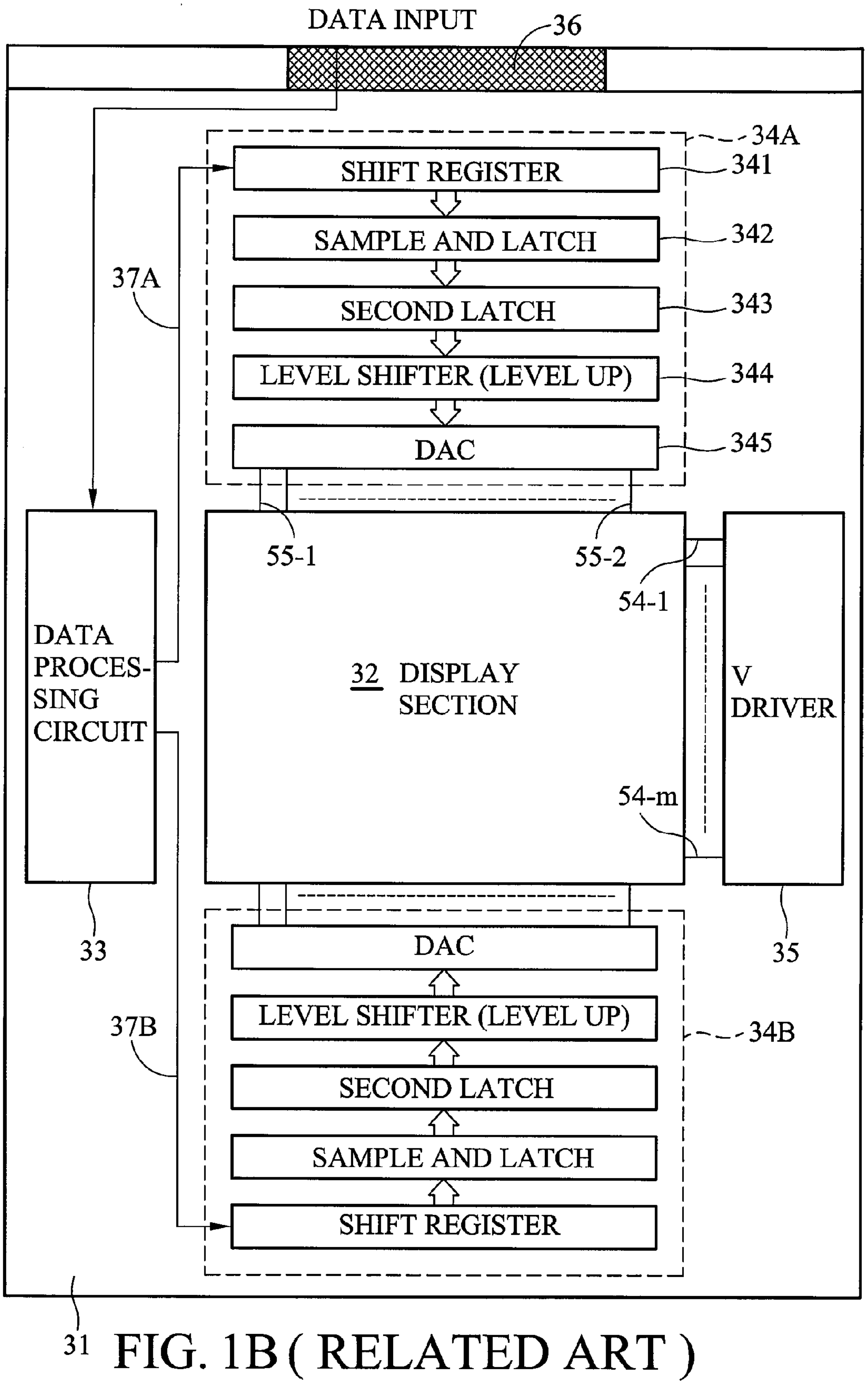
FIG. 1B ( RELATED ART )
FIG. 1B shows a conventional display panel with the conventional data shown in FIG. 1.
Figure 2A:
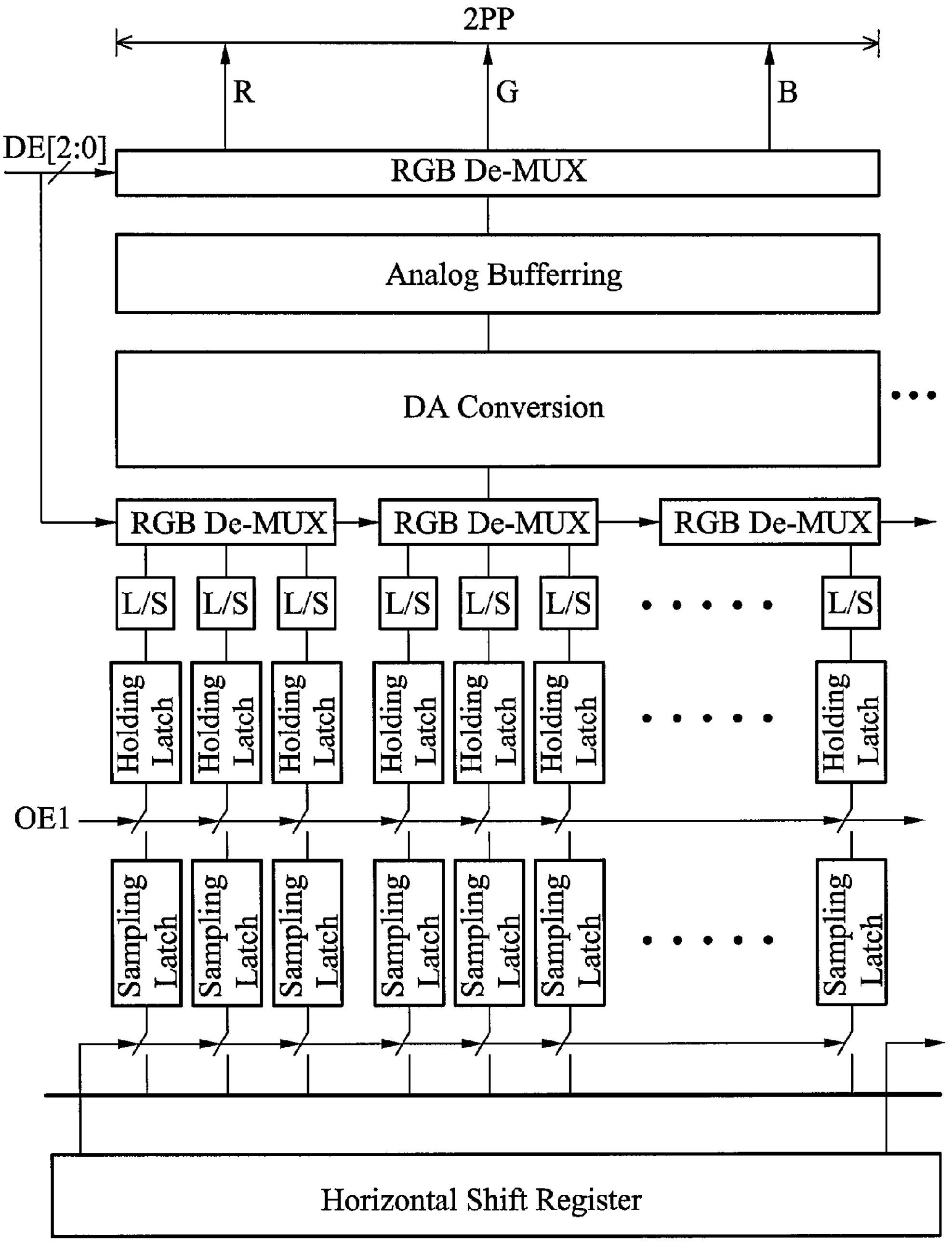
FIG. 2A ( RELATED ART )
FIG. 2A shows another conventional data driver.
Figure 2B:
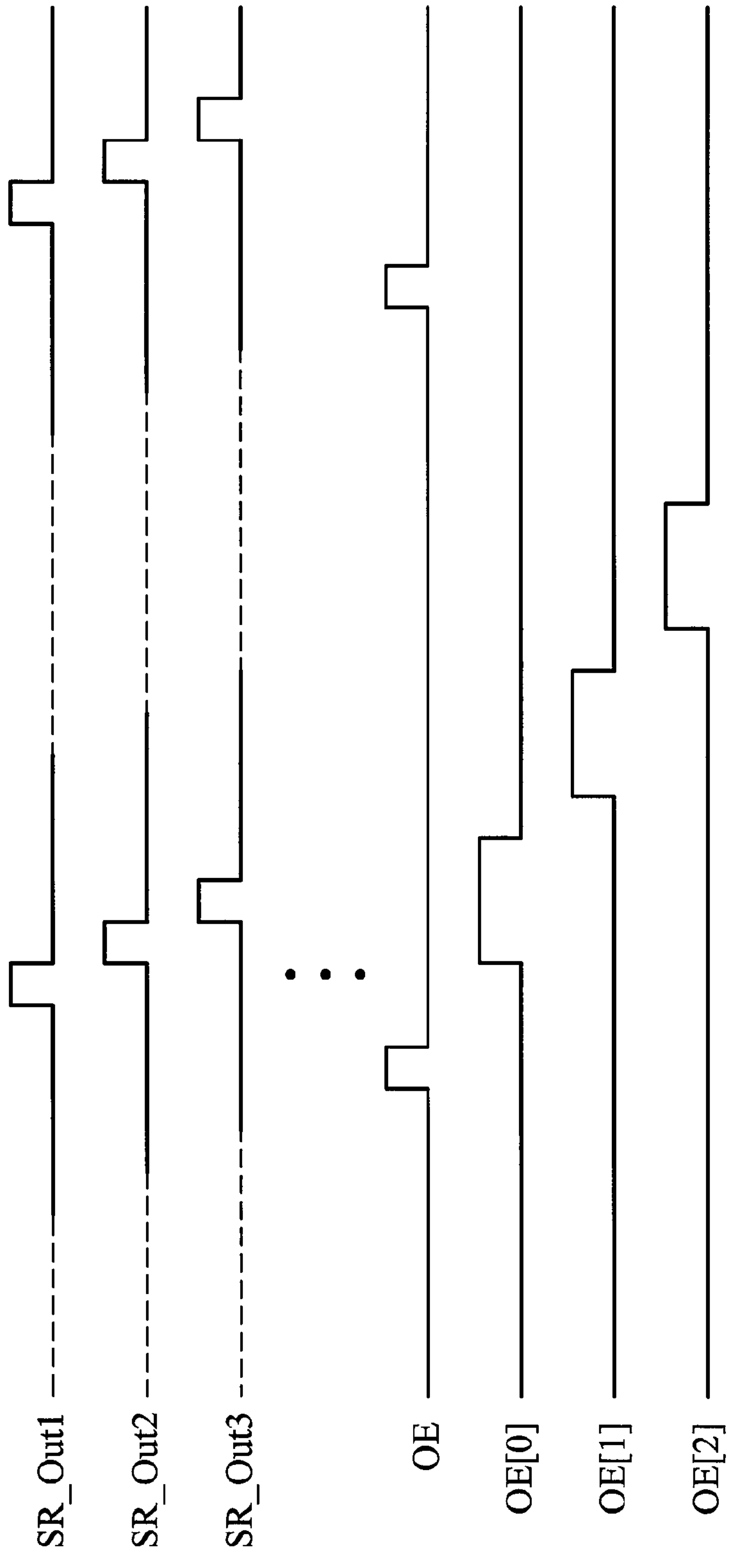
FIG. 2B ( RELATED ART )
FIG. 2B is a timing control diagram of the data driver shown in FIG. 2A.

By sharing latches, analog buffers and DA conversion units, embodiments of the digital data driver and LCD of the invention can reduce layout area thereof, thus potentially preventing layout and wire routing difficulties. Because each driving unit in data driver of some embodiments can be implemented based on the width limitation of double RGB pixel pitch and drive 2 corresponding pixels or implemented based on the width limitation of 3 RGB pixel pitch and drive triple corresponding pixels, the display panel uses a single data driver to drive N pixels rather than two data drivers shown in FIG. 1A. Further, because the display panel requires a single data driver, only one synchronizer is required to synchronize digital data from the host system with the clock signal from timing controller, such that a data processing circuit for dividing input data to the two data drivers can be omitted.

Alternately, when the resolution/or pixel array density of the display panel is increased, layout difficulty in wire routing can be caused by small pixel pitch width for latches, analog buffers and DA conversion units. In some embodiments, each driving unit of the data driver 300 can drive 2 corresponding pixels under the width limitation of double RGB pixel pitch, each driving unit of the data driver 400 can drive 3 corresponding pixels under the width limitation of triple RGB pixel pitch, and so on. When each of the data drivers 34A and 34B is implemented by a data driver such as drivers 300/400, they can drive more pixels under the same layout area, and thus the resolution/or pixel array density of the display panel can be increased.

Figure 6:
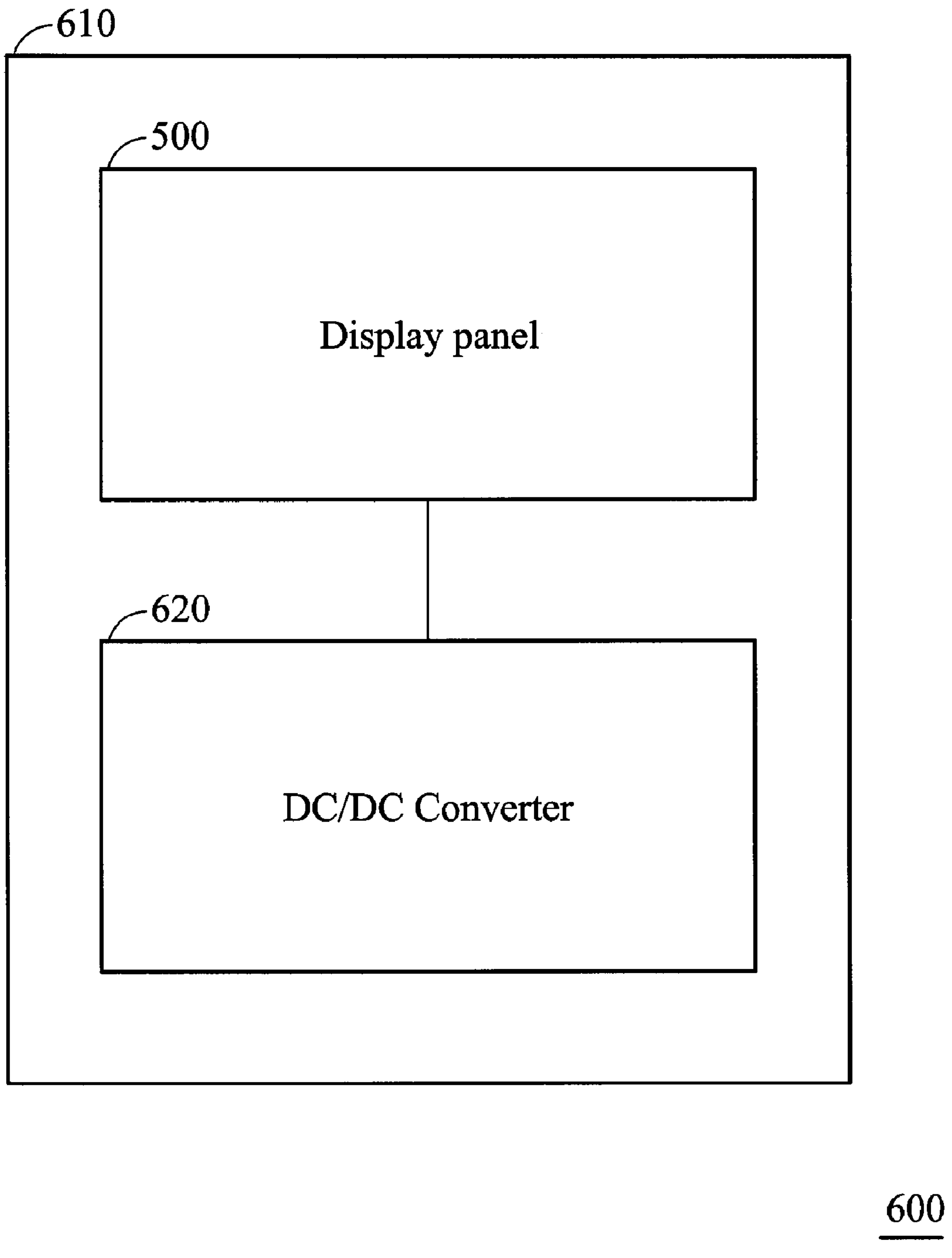
FIG. 6 schematically shows an embodiment of an electronic device.

FIG. 6 schematically shows an embodiment of an electronic device providing driving voltages. In particular, electronic device 600 employs the described display panel 500 shown in FIG. 5. The electronic device 600 may be a device such as a PDA, notebook computer, tablet computer, cellular phone, digital camera, car display or a display monitor device, for example.

Generally, the electronic device 600 comprises a housing 610, a display panel 500 and a DC/DC converter 620, although it is to be understood that various other components can be included, such components not being shown or described here for ease of illustration and description. In operation, the DC/DC converter 620 powers the display panel 500 so that the display panel 500 can display color images.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:

a data driving circuit, comprising a plurality of driving units being operative to generate analog voltage, to drive corresponding pixels according to data signals from a data bus, each driving unit comprising:

a temporary storage unit, operative to store N first digital data in sequence according to N control signals in a first period and outputting the N digital data in sequence according to M switching signals in a second period;

2N sets of latches connected in series;

2N sets of switching elements coupled between each two sets of latches and between the latches and the data bus respectively;

a digital-to-analog (DA) conversion unit, coupled to the temporary storage unit, and operative to convert the N first digital data to N analog voltages in sequence;

an analog buffering unit, operative to buffer the N analog voltages from the DA conversion unit; and a de-multiplexer, operative to selectively output the N analog voltages to the corresponding pixels according to an enabling signal.

2. The system as claimed in claim 1, wherein each driving unit outputs the N analog voltages to the corresponding pixels in sequence during the second period, and the driving unit receives N second digital data in sequence in the meantime.

3. The system as claimed in claim 1, further comprising a synchronizer operative to synchronize the N digital data with the clock signals.

4. The system as claimed in claim 1, wherein each temporary storage unit is controlled by the N control signals and M switching signals, such that each temporary storage unit stores the N first digital data in sequence in the first period and outputs the N analog voltages in the second period.

5. The system as claimed in claim 4, wherein each de-multiplexer outputs the N analog voltages to the corresponding pixels in sequence according to the enabling signal.

6. The system as claimed in claim 1, further comprising a horizontal shifter register operative to generate the N control signals.

7. The system as claimed in claim 1, further comprising a timing controller operative to generate the M switching signals and a clock signal.

8. The system as claimed in claim 1, further comprising a display panel, wherein the data driver is a portion of the display panel.

9. The system as claimed in claim 8, wherein the display panel is an organic light emitting panel, an electroluminescent panel or a LCD panel.

10. The system as claimed in claim 8, further comprising an electronic device, wherein the electronic device comprises:

the display panel; and a power supply powering the display panel to display images.

11. The system as claimed in claim 10, wherein the system is implemented as a PDA, a display monitor, a notebook computer, digital camera, car display, a tablet computer or a cellular phone.

12. A system for displaying images, comprising:

a first pixel;

a second pixel; and a driving unit having a digital to analog converter unit and an analog buffering unit and being operative to drive the first pixel and the second pixel in sequence using the digital to analog unit and analog buffering unit for driving each of the first and second pixels with analog voltages, wherein the driving unit exhibits a width narrower than double RGB pixel pitch (2PP).

13. A system for displaying images, comprising:

a driving circuit, comprising at least one driving unit operative to generate analog voltages according to data signals from a data bus, said at least one driving unit comprising:

a temporary storage unit, operative to store first digital data and second digital data in sequence according to a first control signal and a second control signal and operative to output the first digital data and the second digital data in sequence according to first to third switching signals;

a digital-to-analog (DA) conversion unit, coupled to temporary storage unit, operative to convert the first digital data and the second digital data to a first analog voltage and a second analog voltage;

an analog buffering unit, operative to buffer the first analog voltage and the second analog voltage from the DA conversion unit; and a de-multiplexer, operative to output the first analog voltage and the second analog voltage to drive a first pixel and a second pixel in sequence according to an enabling signal.

14. The system as claimed in claim 13, wherein the temporary storage unit comprises first to fourth sets of latches connected in series to store the first digital data and the second digital data.

15. The system as claimed in claim 14, wherein the temporary storage unit further comprises first to fourth sets of switching elements coupled between the first set of latches and the data bus and between each two sets of the second to fourth sets of latches respectively and controlled by the first and second control signals and the first to third switching signals, storing the first and second digital data in sequence in the first period and outputs the N digital data in sequence in the second period.

16. The system as claimed in claim 15, wherein the first and second sets of switching elements are turned on to store the first digital data to the second set of latches, and then the first set and second set of switching elements are turned on and off respectively to store the second digital data to the first set of latches, according to the first and second control signal, during the first period.

17. The system as claimed in claim 16, wherein the third and fourth sets of switching elements are turned on to store the first digital data to the fourth set of latches and output to the DA conversion unit, and then the second set and third set of switching elements are turned on to store the second digital data to the third set of latches according to the first to third switching signal, during the second period.

18. The system as claimed in claim 17, wherein the fourth set of switching elements are turned on to store the second digital data to the fourth set of latches and output to the DA conversion unit according to the first switching signal, during the second period.

19. The system as claimed in claim 18, wherein the driving unit outputs the first and second analog voltages to the corresponding pixels in sequence during the second period and the driving unit receives third digital data and fourth digital data in sequence in the meantime.

20. The system of claim 19, wherein the first pixel and the second pixel are located in a pixel array adjacent to each other.

21. A method for providing driving voltages of a display panel, comprising:

storing first digital data and second digital data in sequence in a plurality of sets of latches connected in series according to first and second controls signals during a first period;

outputting the first digital data and a second digital data to a digital-to-analog conversion unit in sequence according to first, second and third switching signals during a second period;

converting the first digital data and the second digital data to a first driving voltage and a second driving voltage in sequence; and outputting the first driving voltage and the second driving voltage to a first pixel and a second pixel in sequence according to an enabling signal.

* * * * *